(12) United States Patent
Ekas et al.

(10) Patent No.: US 9,600,366 B1
(45) Date of Patent: Mar. 21, 2017

(54) ERROR DETECTION AND CORRECTION CIRCUITRY

(71) Applicant: Altera Corporation, San Jose, CA (US)

(72) Inventors: Paul B. Ekas, Redwood City, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 42 days.

(21) Appl. No.: 14/632,461

(22) Filed: Feb. 26, 2015

Related U.S. Application Data

(62) Division of application No. 13/035,826, filed on Feb. 25, 2011, now Pat. No. 8,984,367.

(51) Int. Cl.
  G11C 29/00 (2006.01)
  G06F 11/10 (2006.01)

(52) U.S. Cl.
  CPC .......... *G06F 11/1076* (2013.01); *G06F 11/10* (2013.01)

(58) Field of Classification Search
  None
  See application file for complete search history.

(56) References Cited

U.S. PATENT DOCUMENTS

| | | | |
|---|---|---|---|
| 3,766,521 A | 10/1973 | Carter et al. | |
| 5,127,014 A | 6/1992 | Raynham | |
| 5,754,753 A | 5/1998 | Smelser | |
| 6,101,624 A | 8/2000 | Cheng et al. | |
| 6,151,246 A * | 11/2000 | So | B64C 27/006 |
| | | | 365/185.09 |
| 7,328,377 B1 | 2/2008 | Lewis et al. | |
| 7,447,950 B2 | 11/2008 | Takahashi et al. | |
| 7,565,597 B1 | 7/2009 | Branth et al. | |
| 8,064,280 B1 * | 11/2011 | Pan | G11C 7/1045 |
| | | | 365/185.09 |

(Continued)

OTHER PUBLICATIONS

Frenzel, "Crash Course in Digtal Technology. 2nd Ed." In: "Crash Course in Digtal Technology. 2nd Ed.", Jan. 1, 1998, Butterworth-Heinemann, United States of America, XP055240892, ISBN: 978-0-7506-9709-5, pp. 94-95.

(Continued)

*Primary Examiner* — M. Mujtaba Chaudry
(74) *Attorney, Agent, or Firm* — Treyz Law Group, P.C.; Jason Tsai; Andrew C. Milhollin

(57) ABSTRACT

Integrated circuits with memory circuitry may include error detection circuitry and error correction circuitry. The error detection circuitry may be used to detect soft errors in the memory circuitry. The error detection circuitry may include logic gates that are used to perform parity checking. The error detection circuitry may have an interleaved structure to provide interleaved data bit processing, may have a tree structure to reduce logic gate delays, and may be pipelined to optimize performance. The memory circuitry may be loaded with interleaved parity check bits in conjunction with the interleaved structure to provide multi-bit error detection capability. The parity check bits may be precomputed using design tools or computed during device configuration. In response to detection of a memory error, the error correction circuitry may be used to scan desired portions of the memory circuitry and to correct the memory error.

18 Claims, 13 Drawing Sheets

(56) References Cited

U.S. PATENT DOCUMENTS

| | | | |
|---|---|---|---|
| 8,065,574 B1* | 11/2011 | Cheng | G01R 31/31816 714/723 |
| 8,369,175 B1 | 2/2013 | Liu et al. | |
| 8,612,814 B1 | 12/2013 | Tan et al. | |
| 2001/0010084 A1 | 7/2001 | Lin et al. | |
| 2003/0156454 A1 | 8/2003 | Wei et al. | |
| 2004/0240283 A1* | 12/2004 | Tellier | G11C 29/00 365/200 |
| 2007/0061668 A1 | 3/2007 | Wickeraad et al. | |
| 2007/0234101 A1 | 10/2007 | Koktan et al. | |
| 2009/0021989 A1* | 1/2009 | Rashed | G11C 29/021 365/189.09 |
| 2009/0282308 A1 | 11/2009 | Gutsche et al. | |
| 2010/0100779 A1 | 4/2010 | Moriya | |
| 2010/0218072 A1 | 8/2010 | Fukuyama et al. | |
| 2010/0241900 A1* | 9/2010 | Check | G06F 11/1048 714/15 |
| 2010/0246297 A1* | 9/2010 | Zhang | G11O 5/147 365/200 |
| 2011/0099459 A1 | 4/2011 | Nakamura et al. | |

OTHER PUBLICATIONS

Thornwood, "Memory Card Data Fastpath" IBM Technical Disclosure Bulletin, International Business Machines Corp, vol. 37, No. 2A, p. 637-638, Feb. 1, 1994.
Pedersen, U.S. Appl. No. 12/870,383, filed Aug. 27, 2010.
Donald P. Leach et al., "Digital Principles & Applications" In: "Digital Principles & Applications", 1995 Tata McGraw-Hill Education, XP055116330. p. 196.

* cited by examiner

ERROR DETECTION AND CORRECTION CIRCUITRY

CROSS REFERENCE TO RELATED APPLICATION

This application is a division of patent application Ser. No. 13/035,826 filed on Feb. 25, 2011. This application claims the benefit of and claims priority to patent application Ser. No. 13/035,826 filed on Feb. 25, 2011.

BACKGROUND

This relates to integrated circuits and more particularly, to circuitry for detecting memory errors on integrated circuits such as programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into memory elements to configure the devices to perform the functions of the custom logic circuit.

Memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable device, the CRAM cells produce static output signals that are applied to the gates of transistors (e.g., pass transistors). The CRAM output signals turn some transistors on and turn other transistors off. This selective activation of certain transistors on the device customizes the operation of the device so that the device performs its intended function.

When operating in a system, programmable devices are subject to environmental background radiation. Particularly in modern programmable devices that contain large numbers of CRAM cells, there is a possibility that a radiation strike on a CRAM cell will cause the CRAM cell to change its state. For example, a CRAM cell storing a "1" configuration bit may flip its state so that the cell erroneously stores a "0" bit. When a CRAM cell changes state, the transistor that is controlled by that CRAM cell will be placed into an erroneous state. The transistor might, for example, be turned on when it should have been turned off.

Radiation-induced errors that arise in configuration random-access-memory cells are sometimes referred to as soft errors. One way in which soft errors can be addressed is to change the design of the configuration random-access-memory cells. However, changes to the configuration random-access-memory cells can introduce undesired circuit complexity and can consume additional circuit real estate.

Programmable devices sometimes include error detection circuitry that continuously monitors an entire array of CRAM cells. If an error is detected in the array, an error flag may be set. Systems that require highly reliable operations can monitor the status of the error flag to determine whether the programmable device has experienced any soft errors. So long as no errors are present, the system allows the programmable device to operate normally. If, however, the state of the error flag indicates that one of the configuration random-access-memory cells on the device has exhibited a soft error, the system can reconfigure the device by reloading the original configuration data into the configuration random-access-memory cells. Reloading the entire programmable device every time a soft error is detected may, however, result in unnecessarily frequent disruptions and may consume significant amounts of power.

Conventional error detection circuitry such as error detection circuitry that uses cyclic redundancy check (CRC) may perform sequential data checking. The speed of error detection using this sequential approach is limited by the number of data bits that can be processed per clock cycle. For example, conventional error detection circuitry that uses CRC may require more than 100 million clock cycles to determine whether soft errors are present on a programmable device with 100 million CRAM cells.

SUMMARY

Integrated circuits such as programmable integrated circuits may have memory elements coupled to error detection circuitry and error correction circuitry. The error detection circuitry may be used to monitor (scan) the memory cells for the presence of soft errors, whereas the error correction circuitry may be used to correct detected errors.

For example, a programmable integrated circuit may contain one or more arrays of configuration random-access-memory (CRAM) cells. Each array may contain rows and columns of configuration random-access-memory cells that are used for storing configuration data. The integrated circuit may also be organized into different logic regions, each logic region having its own set of memory arrays.

Memory cells that are connected to a common address line may collectively be referred to as a memory cell column. Memory cells that are connected to a common data line (or bit line) may collectively be referred to as a memory cell row. The terms rows and columns may sometimes be used interchangeably. The address lines may be connected to respective address registers, whereas the data lines may be connected to a data register.

The error detection circuitry may process each cell column to scan for soft errors. In response to a detected error, the error correction circuitry (e.g., an error-correcting-code circuit) may locate and correct the soft error. If desired, a selected region in the memory array may be reconfigured (reprogrammed) to overwrite the error. The speed at which the error detection circuitry scans a given column may be more than 100 faster than the speed at which the error correction circuitry locates and corrects the error in the given column. The speed of the error detection circuitry may be defined as the time period from a memory bit being transferred from a data register to the error detection circuitry to the assertion of an error signal. The speed of the error correction circuitry may be defined as the time period from error detection to the time corrected data is written into the cell holding erroneous data. For example, the error detection circuitry may take 10 ns to detect an error in a cell column, whereas the error correction circuitry may take more than 1 us to locate and correct the error in that cell column.

The memory error detection circuitry may include logic gates such as logic exclusive-OR (XOR) gates coupled to the data register. The XOR gates may be arranged in groups of linear chains or binary trees. Different groups of chains or trees may be interleaved to provide single-bit or adjacent multi-bit error detection capability. Single-bit error detection capability may involve a single parity bit for each group of memory cells, whereas multi-bit error detection capability may involve multiple parity bits for each group of memory cells. The linear chains may be pipelined to satisfy error detection performance criteria.

The parity bits may be precomputed using computer-aided-design tools such as logic design tools or may be computed during device configuration (e.g., during loading). Memory error detection circuitry with a single parity bit per column may generate a single error signal that indicates whether a single-bit error has been detected. Memory error detection circuitry having multiple interleaved parity bits per column may generate multiple error signals that indicate whether a multi-bit adjacent error has been detected. Single-bit errors and multi-bit errors may be corrected via error correction using the ECC circuitry or device reconfiguration.

Further features of the present invention, its nature and various advantages will be more apparent from the accompanying drawings and the following detailed description.

DETAILED DESCRIPTION

Embodiments of the present invention relate to integrated circuits and more particularly, to integrated circuits with memory elements.

Integrated circuits that contain memory elements may include memory chips, digital signal processing circuits with memory arrays, microprocessors, application specific integrated circuits with memory arrays, programmable logic device integrated circuits or other programmable integrated circuits in which memory elements are used for configuration memory, or other suitable integrated circuits.

Integrated circuits such as programmable integrated circuits use programmable memory elements to store configuration data. During the programming of a programmable integrated circuit, configuration data is loaded into the memory elements. During operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
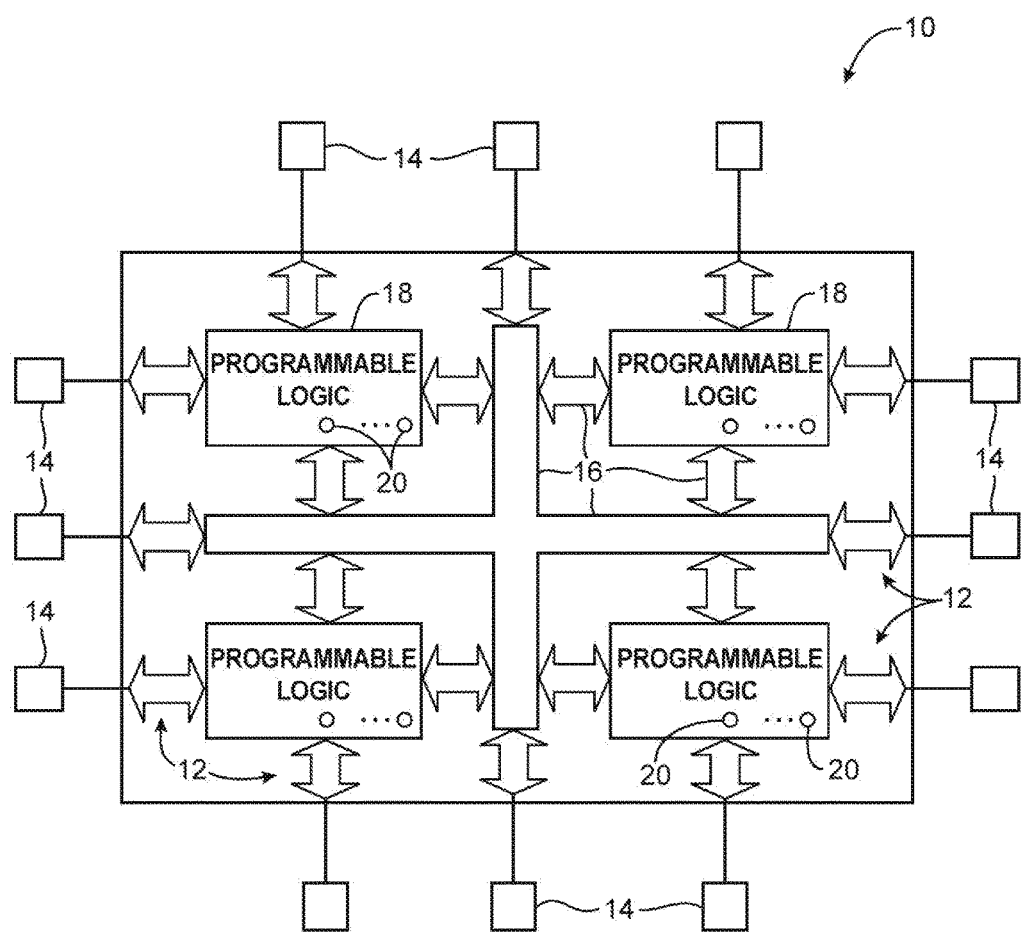
FIG. 1 is a diagram of an illustrative programmable integrated circuit in accordance with an embodiment of the present invention.

As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically, the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
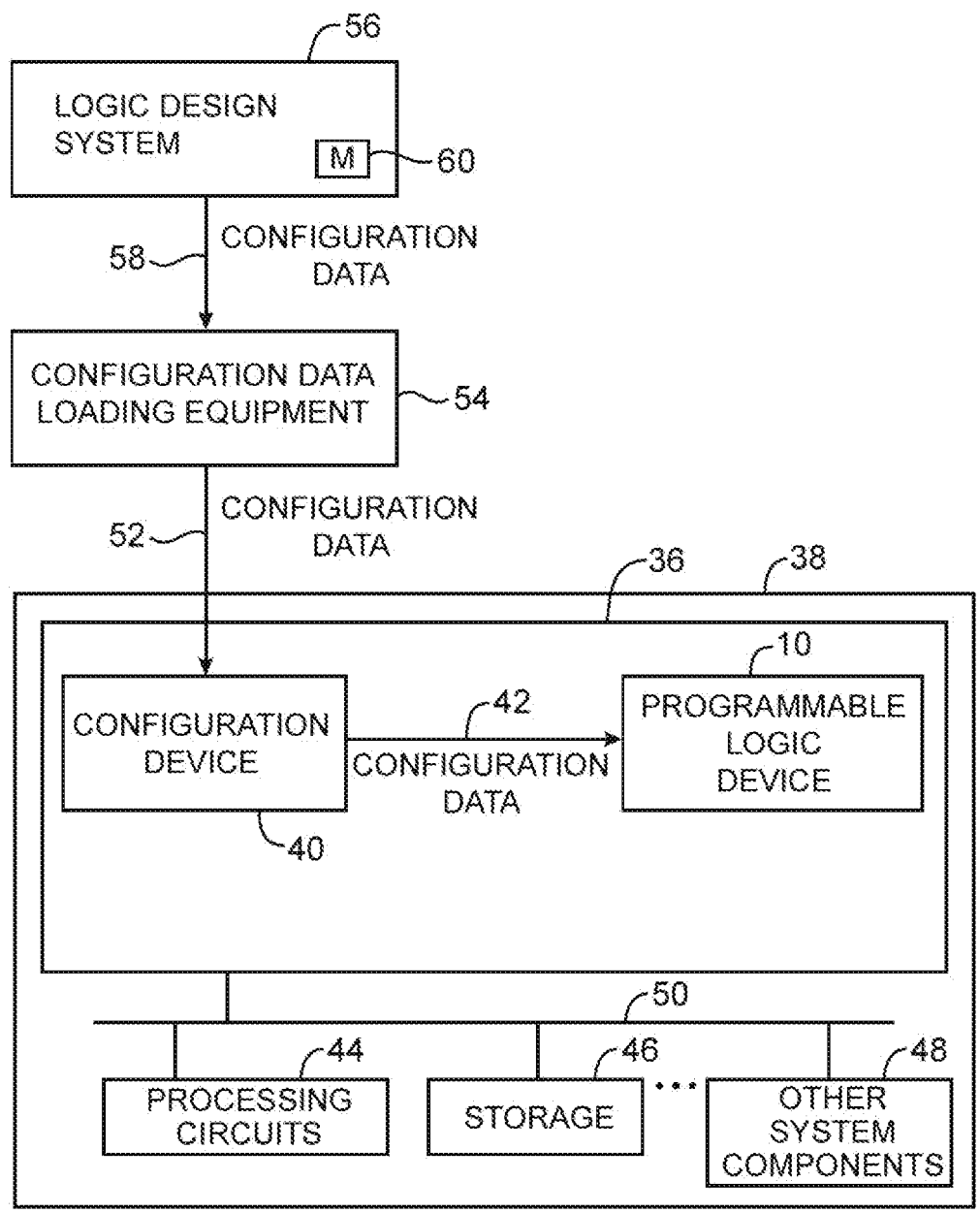
FIG. 2 is a diagram showing creation of configuration data by a logic design system and configuring the device for operation in a system based on the configuration data in accordance with an embodiment of the present invention.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

Figure 3:
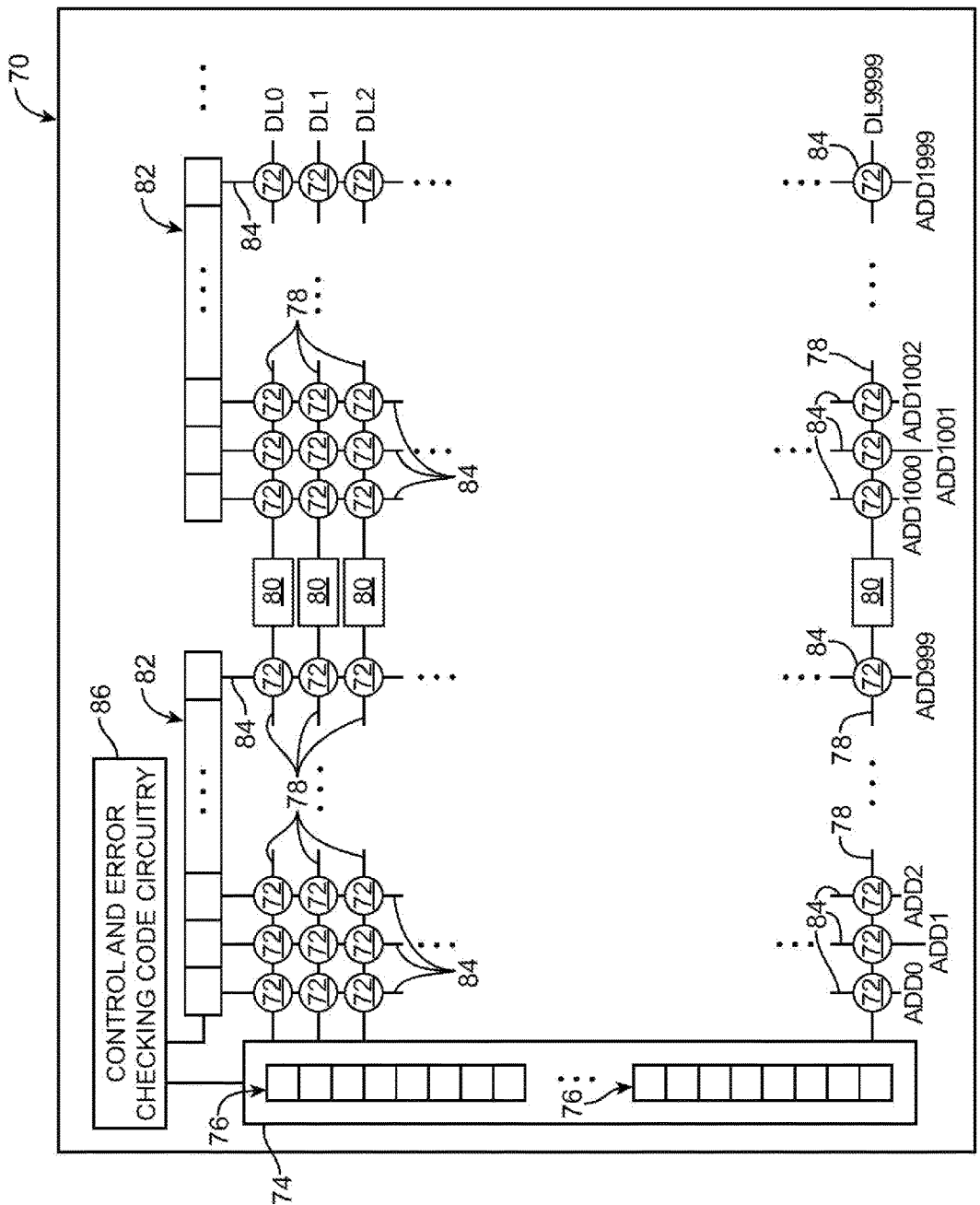
FIG. 3 is a diagram of a programmable integrated circuit with error detection and correction circuitry.

FIG. 3 is a diagram of a programmable integrated circuit with conventional error detection and correction circuitry. As shown in FIG. 3, programmable integrated circuit 70 includes CRAM cells 72 arranged in rows and columns. Device 70 may, for example, include 10,000 rows of CRAM cells 72 and 10,000 columns of CRAM cells 72.

Each column of cells 72 is connected to a respective address line 84. In particular, a first column of cells 72 is connected to first address line 84 (i.e., an address line on which address signal ADD0 is conveyed), whereas a second column of cells 72 is connected to second address line 84 (i.e., an address line on which address signal ADD1 is conveyed), etc. CRAM cells 72 are organized into ten groups of cells 72, each of which includes 1000 cell columns. The cells along a given bit line are separated by data line buffers 80 between each group of cells 72. Each group of cells 72 receives address signals from a corresponding address shift register 82. For example, a first group of cells 72 is controlled by address signals ADD0-ADD999 that are provided by first address shift register 82, whereas a second group of cells 72 is controlled by address signals ADD1000-ADD1999 that are provided by second address shift register 82, etc.

Each row of cells 72 is connected to a respective data line 78. In particular, a first row of cells 72 is connected to first data line 78 (i.e., a data line on which data line signal DL0 is conveyed), whereas a second column of cells 72 is connected to second data line 78 (i.e., a data line on which data line signal DL1 is conveyed), etc. Data lines 78 that are associated with a given group of cells 72 are coupled to data lines 78 that are associated with an adjacent group of cells 72 through data line buffers 80, as shown in FIG. 3. For example, data line 78 that is associated with the first row of cells 72 in the first group is connected to data line 78 that is associated with the first row of cells 72 in the second group through first data line buffer 80.

Data lines 78 are connected to data register 74. Data register 74 contains 10,000 flip-flops that each communicate with a respective cell row. To improve data transfer speed compared to a single one-bit wide transfer, data register 74 includes eight shift registers 76, each of which contains 1,250 flip-flops connected in series. Each group of eight consecutive cell rows is connected to corresponding flip-flops in the eight shift registers 76. For example, a first row of cells 72 is connected to a first flip-flop in first shift register 76, whereas a second row of cells 72 is connected to a first flip-flop in second shift register 76, whereas a third row of cells 72 is connected to a first flip-flop in third shift register 76, . . . , whereas a ninth row of cells 72 is connected to a second flip-flop in first shift register 76, a tenth row of cells 72 is connected to a second flip-flop in second shift register 76, an eleventh row of cells 72 is connected to a second flip-flop in third shift register 76, etc.

Address register 82 and data register 74 are connected to control and error checking code (ECC) circuitry 86. ECC circuitry 86 can detect an error on device 70, identify the location of the error, and optionally rewrite correct data. ECC circuitry 86 performs error detection using a sequential process. The speed of error detection using circuitry 86 is therefore limited by the number of data bits that can be processed per clock cycle (i.e., error detection speed is limited by the number of clock cycles required to serially shift out each column of data).

Consider the example in which device 10 contains 10,000 rows and 10,000 columns of CRAM cells 72 and eight 1,250-bit shift registers 76. During error detection mode, a column of cells 72 is latched by data register 74 in parallel (i.e., each shift register 76 latches 1,250 corresponding memory data bits in parallel). The data bits are then serially shifted out to ECC circuitry 86. Shifting out one column of cells 72 therefore requires 1,250 clock cycles. Shifting out all 10,000 columns in device 70 to circuitry 86 therefore requires 12,500,000 clock cycles (1,250 multiplied by 10,000). With a typical 10 ns clock cycle, ECC circuitry 86 takes 125 ms (12,500,000*10*10$^{-9}$) to perform error detection across an entire array of CRAM cells 72. The speed of error detection using ECC circuitry 86 may be unacceptably slow for modern devices that include an increasing number of memory cells.

Figure 4:
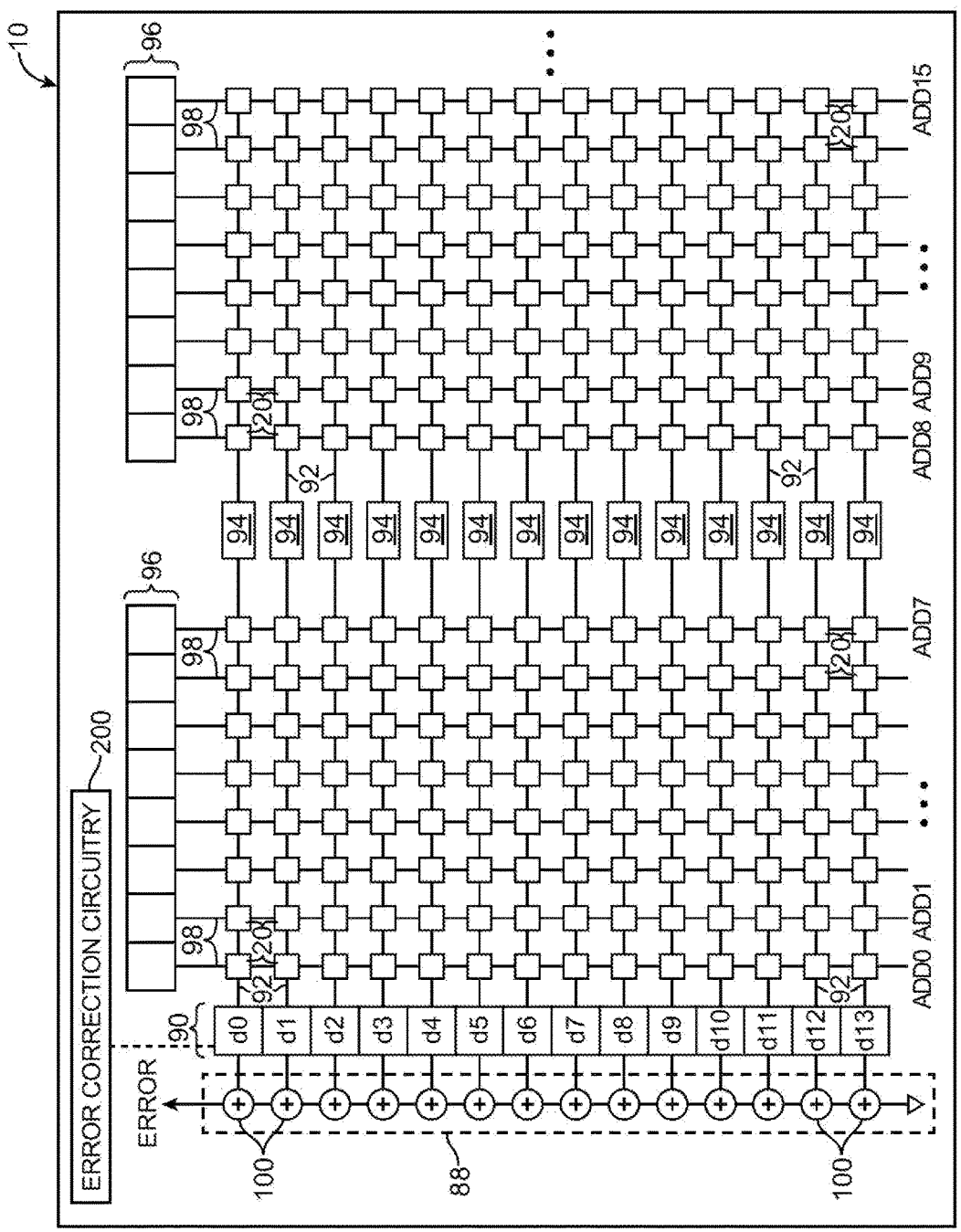
FIG. 4 is a diagram of an illustrative integrated circuit with error detection circuitry and error correction circuitry in accordance with an embodiment of the present invention.

FIG. 4 shows integrated circuit 10 having error detection circuitry with improved error detection speed. As shown in FIG. 4, device 10 may include memory elements 20 arranged in an array. Memory elements 20 may be random-access-memory (RAM) elements such as static random-access-memory (SRAM) cells or configuration random-access-memory (CRAM) cells, non-volatile memory elements, or other types of memory elements. Device 10 may include any desired number of rows and columns of memory cells 20.

Each column of cells 20 may be connected to a respective address line 98. For example, a first column of cells 20 may be connected to first address line 98 (e.g., an address line on which address signal ADD0 is conveyed), whereas a second column of cells 20 may be connected to second address line 98 (i.e., an address line on which address signal ADD1 is conveyed), etc.

As shown in FIG. 4, cells 20 may be organized into different groups of cells 20, each of which includes eight columns of cells 20. Each group of cells 20 may receive address signals from a corresponding address register 96. For example, a first group of cells may be controlled by address signals ADD0-ADD7 that are provided by first address register 96, whereas a second group of cells may be controlled by address signals ADD8-ADD15 that are provided by second address register 96, etc.

The arrangement of FIG. 4 is merely illustrative. If desired, the memory array of device 10 may be arranged into groups of any desired size (e.g., each group of cells may include more than eight cell columns, less than eight cell columns, one thousand or more cell columns, ten thousand or more cell columns, etc.). Each address register 96 may have a length that is equal to the number of cell columns in each group of cells.

Each row of cells 20 may be connected to a respective data line 92 (sometimes referred to as a bit-line). For example, a first row of cells may be connected to first data line 92, whereas a second row of cells 20 may be connected to second data line 92, etc. Data lines 92 that are associated with a given group of cells may be coupled to data lines 92 that are associated with an adjacent group of cells through respective data line buffers such as data line buffers (DLBs) 94 (see, e.g., FIG. 4). For example, data line 92 that is associated with the first row of cells in the first group may be coupled to data line 92 that is associated with the first row of cells in the second group through first DLB 94.

Data lines 92 may be connected to data register 90. Data register 90 is formed from a chain of data storage elements such as flip-flops (sometimes referred to as data bit storage elements or cells). Data register 90 may include multiple shift registers. Each of the shift registers may include flip-flops connected in series. The shift registers in data register 90 may serve to latch data from a selected column of memory cells 20 in parallel. The shift registers may be connected to data lines 92 using a "distributed" wiring arrangement.

For example, consider the memory circuitry as shown in FIG. 4. The memory circuitry of FIG. 4 includes 14 rows of cells 20 (as an example). Each group of two consecutive rows of cells 20 may be connected to corresponding flip-flops in first and second shift registers in data register 90. In particular, a first row of cells 20 may be connected to a first flip-flop in the first shift register, whereas a second row of cells 20 may be connected to a first flip-flop in the second shift register, whereas a third row of cells 20 may be connected to a second flip-flop in the first shift register, whereas a fourth row of cells may be connected to a second flip-flop in the second shift register, . . . , whereas a thirteenth row of cells 20 may be connected to a seventh flip-flop in the first register, and whereas a fourteenth row of cells 20 may be connected to a seventh flip-flop in the second shift register.

Consider another example in which device 10 includes 10,000 cell rows. Data register 90 may include eight shift registers, each of which contains 1,250 flip-flops connected in series. Each group of eight consecutive rows of cells 20 may be connected to corresponding flip-flops in the eight shift registers. In particular, a first row of cells 20 may be connected to a first flip-flop in a first shift register, whereas a second row of cells 20 may be connected to a first flip-flop in a second shift register, whereas a third row of cells 20 may be connected to a first flip-flop in a third shift register, . . . , whereas a ninth row of cells 20 may be connected to a second flip-flop in the first shift register, whereas a tenth row of cells 20 may be connected to a second flip-flop in the second shift register, whereas an eleventh row of cells 20 may be connected to a second flip-flop in the third shift register, etc.

The example of FIG. 4 is merely illustrative. Any desired number of cell rows may be formed on device 10 (e.g., device 10 may include ten or more rows or one thousand or more rows of cells 20). Data register 90 may be partitioned into any desired number of shift registers and may be connected to data lines 92 using the distributed wiring arrangement described herein.

For clarity, the partitioning of data register 90 into the multiple shift registers and the distributed connections between the multiple shift registers and data lines 92 are not shown in FIG. 4. For simplicity, assume that first data line 92 is connected to a first flip-flop in the first bit position in data register 90 (e.g., the flip-flop that is storing memory data bit d0), that second data line 92 is connected to a second flip-flop in the second bit position in data register 90 (e.g., the flip-flop that is storing memory data bit d1), that third data line 92 is connected to a third flip-flop in the third bit position in data register 90 (e.g., the flip-flop that is storing memory data bit d2), etc.

Device 10 may include error detection circuitry such as error detection circuitry 88. Circuitry 88 may include logic XOR gates such as XOR gates 100 arranged in a linear chain (e.g., a 14-bit linear chain). Each XOR gate 100 may have an output, a first input that receives data from a corresponding flip-flop in data register 90, and a second input that is connected to the output of preceding XOR gate 100. Exclusive-OR gate 100 with a first input that is connected to the first flip-flop of register 90 may be referred to as the "tail" XOR gate, whereas XOR gate 100 with a first input that is connected to the last flip-flop (i.e., the flip-flop that latches data from the last row of cells 20) of register 90 may be referred to as the "head" XOR gate. The first input of the head XOR gate may be connected to a ground power supply line, whereas the tail XOR gate may generate an error signal ERROR at its output.

Parity bits (or parity check bits) may be loaded into a selected row of memory cells 20 (e.g., parity bits may be loaded into parity bit memory elements arranged along the selected cell row). For example, parity bits may be loaded into the first cell row designated by d0 prior to error detection operations. The parity bits may be loaded into another row or other rows of cells 20, if desired. Because the parity is set to produce a logic "0" when there is no error, the parity bit is only used for a parity computation and is not used to control any configurable circuitry. The parity bits may be predetermined using design tools 56 described in connection with FIG. 2.

In other suitable arrangements, multiple parity bits may be loaded into each column. For example, there may be two parity bits per column, where a first parity bit is associated with even numbered (indexed) memory elements and a second parity bit is associated with odd numbered memory elements. In general, the structures defined herein can be extended to multiple parity bits interleaved or otherwise grouped for the memory bits in each column. Configurations that use multiple parity bits interleaved across the memory bits in each column provide the additional capability to detect multiple adjacent errors.

During error detection mode, data from a selected column of cells 20 may be latched by data register 90. After a propagation delay that is proportional to the number of series-connected gates 100, signal ERROR will indicate whether the selected column of cells exhibits a single-bit error. For example, if signal ERROR is low, no soft error is detected. If signal ERROR is high, the selected column exhibits a single-bit error. Error detection circuitry 88 of FIG. 4 may be capable of detecting whether the selected column of cells 20 contains a single-bit error in a single clock cycle. Because the accuracy of circuitry 88 depends on the accuracy of the predetermined parity bits, circuitry 88 may sometimes be referred to as a parity checking circuit.

Error detection circuitry 88 may detect an error more rapidly than ECC circuitry 86 and may be used in conjunction with ECC circuitry 86 to provide improved error detection and correction speed. Error detection circuitry 88 may be used to sequentially scan and detect errors in each cell column. In response to an error being detected, error correction circuitry 200 (e.g., an ECC circuitry) can be used to determine the exact location of the error and to correct the error (e.g., to write the corrected data back into the array). Error correction circuitry in control block 86 of FIG. 3 may be used to perform correction once the error is detected.

For example, consider a scenario in which ECC circuitry 86 is used to perform error detection and correction across a memory array with 10,000 rows and 10,000 columns. With a typical 10 ns clock cycle per bit, error detection and correction across the entire array using ECC circuitry 86 may require more than 100 ms.

Consider another scenario in which error detection circuitry 88 is used to detect an error across a memory array with 10,000 rows and 10,000 columns. With a typical 10 ns clock cycle per column, error detection across the entire array using error detection circuitry 88 may only require 100 μs (as an example). ECC circuitry 200 may then be used to locate and correct detected errors. If desired, a selected region in the memory array may be reconfigured (reprogrammed) to overwrite the error.

The speed at which the error detection circuitry scans a given column may be more than 100 times faster than the speed at which the error correction circuitry locates and corrects the error in the given column. For example, the error detection circuitry may take 10 ns to detect an error in a column, whereas the error correction circuitry may take more than 1 μs to locate and correct the error in that cell column. Thus, by engaging the error correction circuitry only when an error is detected, all error-free columns can be processed within 10 ns while the 1 μs correction time is used for columns that contain an error.

As shown in this example, error detection circuitry 88 can be used to improve error detection speed in comparison to ECC circuitry 86.

Figure 5A:
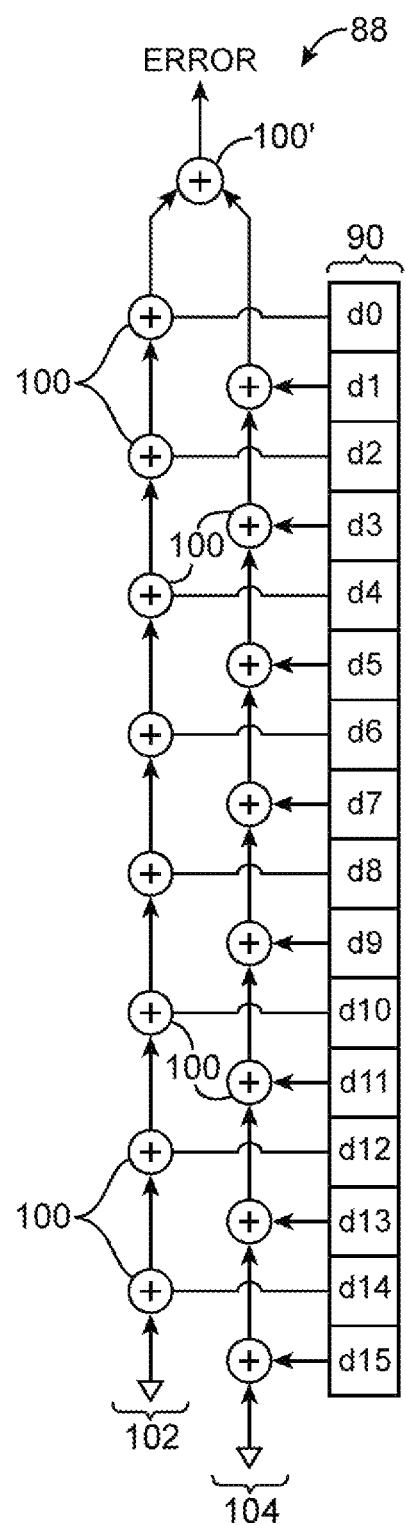
FIG. 5A is a diagram of illustrative error detection circuitry with an interleaved structure suitable for detecting single-bit errors in accordance with an embodiment of the present invention.

Error detection circuitry of FIG. 4 has a non-interleaved arrangement. As shown in FIG. 5A, error detection circuitry 88 may be arranged using an interleaved structure to provide single-bit error detection capability (e.g., circuitry 88 has a single output signal ERROR that indicates whether a single-bit error is detected). For example, circuitry 88 of FIG. 5A may include a first group of logic gates such as first linear chain 102 and a second group of logic gates such as second linear chain 104. The first group of gates (i.e., the set of logic circuits associated with the even subset of data elements in register 90 of FIG. 5A) and the second group of gates (i.e., the set of logic circuits associated with the odd subset of data elements in register 90) can independently check for errors in the even and odd groups of data elements. Linear chains 102 and 104 are eight-bit linear chains. A set of parity bits may be loaded into a given row of cells 20.

First linear chain 102 may include a chain of logic XOR gates 100, each of which has an output, a first input that is connected to corresponding even data bit indices in data register 90 (e.g., the first input of first XOR gate 100 in chain 102 may be connected to the flip-flop that stores bit d0, whereas the first input of second XOR gate 100 in chain 102 may be connected to the flip-flop that stores bit d2, etc.), and a second input that is connected to the output of preceding XOR gate 100 in chain 102. Second linear chain 104 may include a chain of logic XOR gates 100, each of which has a first input that is connected to corresponding odd data bit indices in data register 90 (e.g., the first input of first XOR gate 100 in chain 104 may be connected to the flip-flop that stores bit d1, whereas the first input of second XOR gate 100 in chain 104 may be connected to the flip-flop that stores bit d3, etc.), and a second input that is connected to the output of preceding XOR gate 100 in chain 104.

The second input of the head XOR gate in chain 102 (e.g., XOR gate 100 having a first input that receives bit d14) and the second input of head XOR gate in chain 104 (e.g., XOR gate 100 having a first input that receives bit d15) may be connected to the ground line. The tail XOR gate of chain 102 (e.g., XOR gate 100 having a first input that receives bit d0) may have an output that is connected to a first input of combining XOR gate 100', whereas the tail XOR gate of chain 104 (e.g., XOR gate 100 having a first input that receives bit d1) may have an output that is connected to a second input of logic XOR gate 100'. The tail XOR gate of chain 102 may output a first error detection signal that indicates whether an error has been detected for the data bits corresponding to even bit indices, whereas the tail XOR gate of chain 104 may output a second error detection signal that indicates whether an error has been detected for the data bits corresponding to odd bit indices. Exclusive-OR gate 100' may generate error signal ERROR at its output based on the first and second error detection signals. If ERROR is low, the selected column is free of soft errors. If ERROR is high, the selected column may exhibit a single-bit error.

Figure 5B:
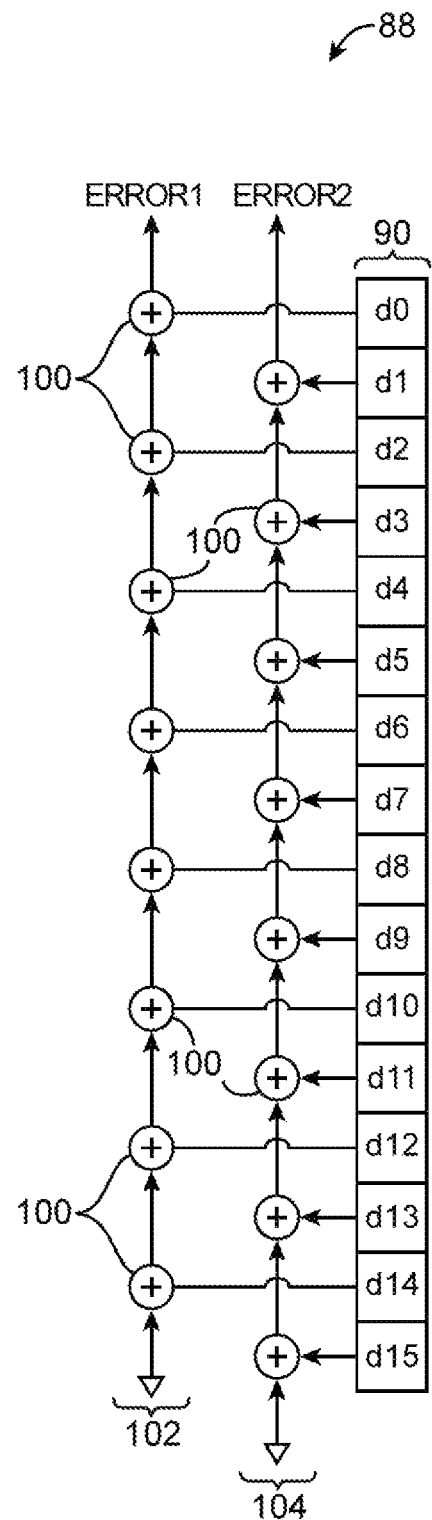
FIG. 5B is a diagram of illustrative error detection circuitry with an interleaved structure suitable for detecting adjacent multi-bit errors in accordance with an embodiment of the present invention.

Circuitry 88 may also provide multi-bit error detection capability. As shown in FIG. 5B, chain 102 may generate first error signal ERROR1, whereas chain 104 may generate a second error signal ERROR2 that is separate from first error signal ERROR1. A first set of parity bits may be loaded into a given row of cells 20, whereas a second set of parity bits may be loaded into another row of cells 20 that is different than the given row (e.g., interleaved parity bits may be used to provide multi-bit error detection capability). If signal ERROR1 is low, the corresponding bits (e.g., data bits stored in the even numbered rows in the selected column) are free of soft errors. If signal ERROR1 is high, then the selected cells corresponding to the even indices in that column may exhibit a single-bit error. If signal ERROR2 is low, the corresponding bits (e.g., data bits stored in the odd numbered rows in the selected column) are free of soft errors. If signal ERROR2 is high, then the selected cells corresponding to the odd indices in that column may exhibit a single-bit error.

Signals ERROR1 and ERROR2 may therefore indicate whether a double-bit adjacent error has been detected using circuitry 88.

Error detection circuitry 88 of FIGS. 5A and 5B are said to be two-way interleaved (e.g., to provide interleaved processing), because two linear chains (e.g., chains 102 and 104) are used to process all the data bits in data register 90. Error signals generated by multiple interleaved chains may either produce multiple parity bits, detect multiple errors, or be combined into a single parity bit for detecting a single-bit error. If desired, circuitry 88 may have a three-way interleaved structure (e.g., three linear chains are used to process all the data bits in data register 90) that uses a single parity bit to provide single-error detection capability or that uses three separate interleaved parity bits to provide triple-bit error adjacent detection capability error signals, a four-way interleaved structure with up to four-interleaved bits to provide up to four-bit adjacent error detection capability, etc. The examples of FIGS. 5A and 5B are merely illustrative. An interleaved structure may be used to process memory arrays with any number of rows.

Figure 6:
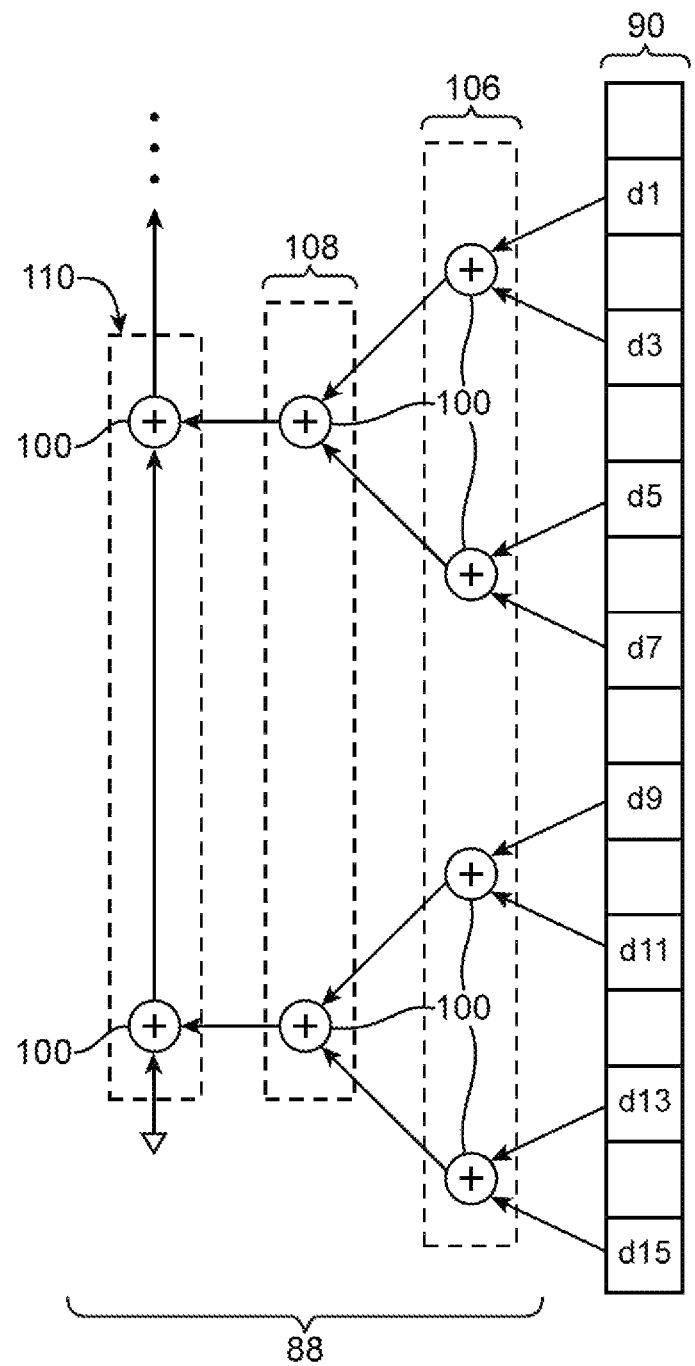
FIG. 6 is a diagram of illustrative error detection circuitry with an interleaved-tree structure in accordance with an embodiment of the present invention.

The error detection speed of circuitry 88 in FIGS. 5A and 5B are dependent on the propagation delay of each linear chain. In particular, the propagation delay may be proportional to the length of linear chains 102 and 104. Error detection circuitry 88 may be arranged using a hybrid tree structure to reduce the propagation delay, while preserving the ability to identify errors in multiple bits. The example of FIG. 6 shows two-way interleaving with a tree structure. Only one of the two interleaved four-bit trees is shown for clarity. To accommodate two-bit interleaving, a first set of parity bits may be loaded into a given row of cells 20, whereas a second set of parity bits may be loaded into another row of cells 20 that is different than the given row.

As with the arrangement of FIGS. 5A and 5B, circuitry 88 of FIG. 6 may include first logic circuitry for monitoring the status of a first subset of the bits in register 90 (e.g., the even subset of bits) and second logic circuitry for monitoring the status of a second subset of the bits in register 90 (e.g., the odd subset of bits that alternates with the even subset of bits). Circuitry 88 of FIG. 6 may, for example, include a first group (level) of XOR gates 100 such as group 106 and a second group (level) of XOR gates 100 such as group 108. Each XOR gate 100 in group 106 may have first and second inputs that are connected to respective odd data bit indices in data register 90 (e.g., the first input of first XOR gate 100 in group 106 may be connected to the flip-flop that stores bit d1, whereas the second input of first XOR gate 100 in group 106 may be connected to the flip-flop that stores bit d3, whereas the first input of second XOR gate 100 in group 106 may be connected to the flip-flop that is stores bit d5, whereas the second input of second XOR gate 100 in group 106 may be connected to the flip-flop that is stores bit d7, etc.). The group of gates 100 with inputs connected to respective even data bit indices in data register 90 is not shown for clarity.

Each XOR gate 100 in group 108 may have first and second inputs that are connected to respective outputs of gates 100 in group 106. Gates 100 in group 108 may each have an output that is connected to a corresponding XOR gate 100 in two-bit linear chain 110. The propagation delay of two-way interleaved error detection circuitry 88 with four-bit tree circuits in FIG. 6 is proportional to $N/k+\log_2(k)$, where N is the length of data register 90 (i.e., the number of cell rows) and k is the number of inputs to each tree. If desired, circuitry 88 may include eight-bit trees (e.g., binary trees each of which processes eight bits of memory data), 16-bit trees (e.g., binary trees each of which processes 16 bits of memory data), or other types of tree structures to process memory arrays with any number of rows.

Figure 7:
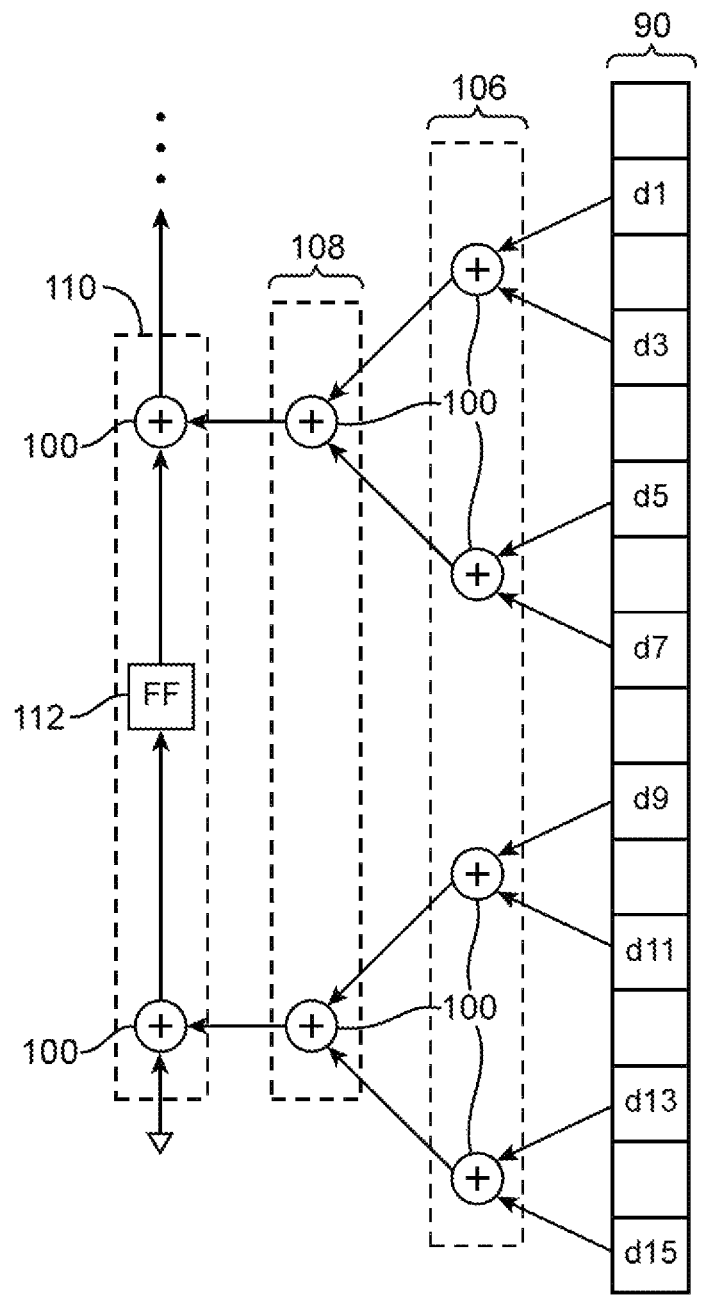
FIGS. 7 and 8 are diagrams of illustrative error detection circuitry with a pipelined-interleaved-tree structure in accordance with an embodiment of the present invention.

Linear chain 110 may introduce additional gate delay. Linear chain 110 may include a pipeline flip-flop such as flip-flop 112 coupled between two XOR gates 100 to reduce the additional gate delay, as shown in FIG. 7. Pipelining linear chains in error detection circuitry 88 in this way may serve to further optimize error detection speed for devices 10 with thousands of cell rows.

Figure 8:
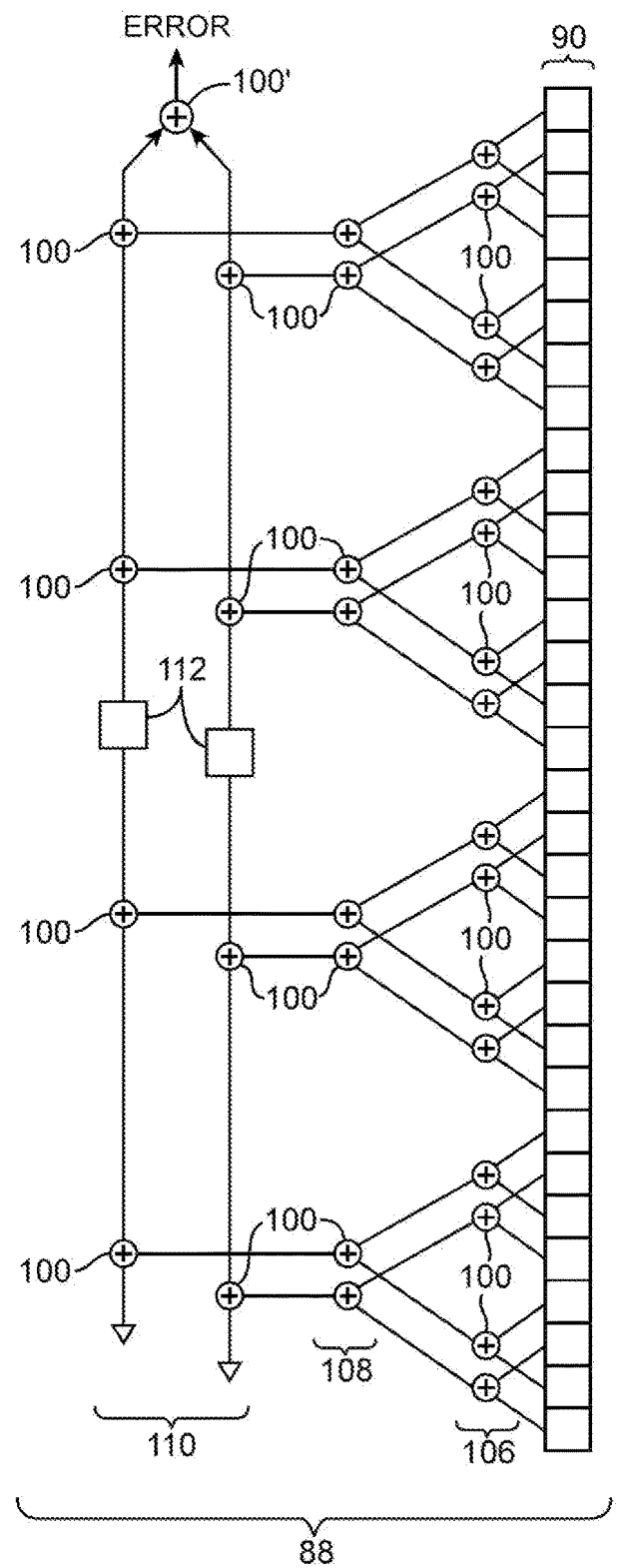

FIG. 8 is a diagram showing illustrative pipelined (e.g., two-bit linear chain per pipeline stage)/two-way interleaved error detection circuitry 88 with four-bit trees (sometimes referred to as four-bit tree circuits). In this example, 32 bits of memory data may be processed per clock cycle, because eight sets of four-bit trees may be processed per clock cycle. The clock cycle (or clock period) may be limited by the amount of time required to perform a read operation. If a read operation can be accomplished within a 10 ns clock cycle, a selected column of cells 20 can be processes every 10 ns. For device 10 that includes 10,000 rows and 10,000 columns of cells 20, error detection can be performed in 100 μs ($10{,}000*10*10^{-9}$), which is 1,250 times faster than the 125 ms required by circuitry 86 of FIG. 3.

Figure 9:
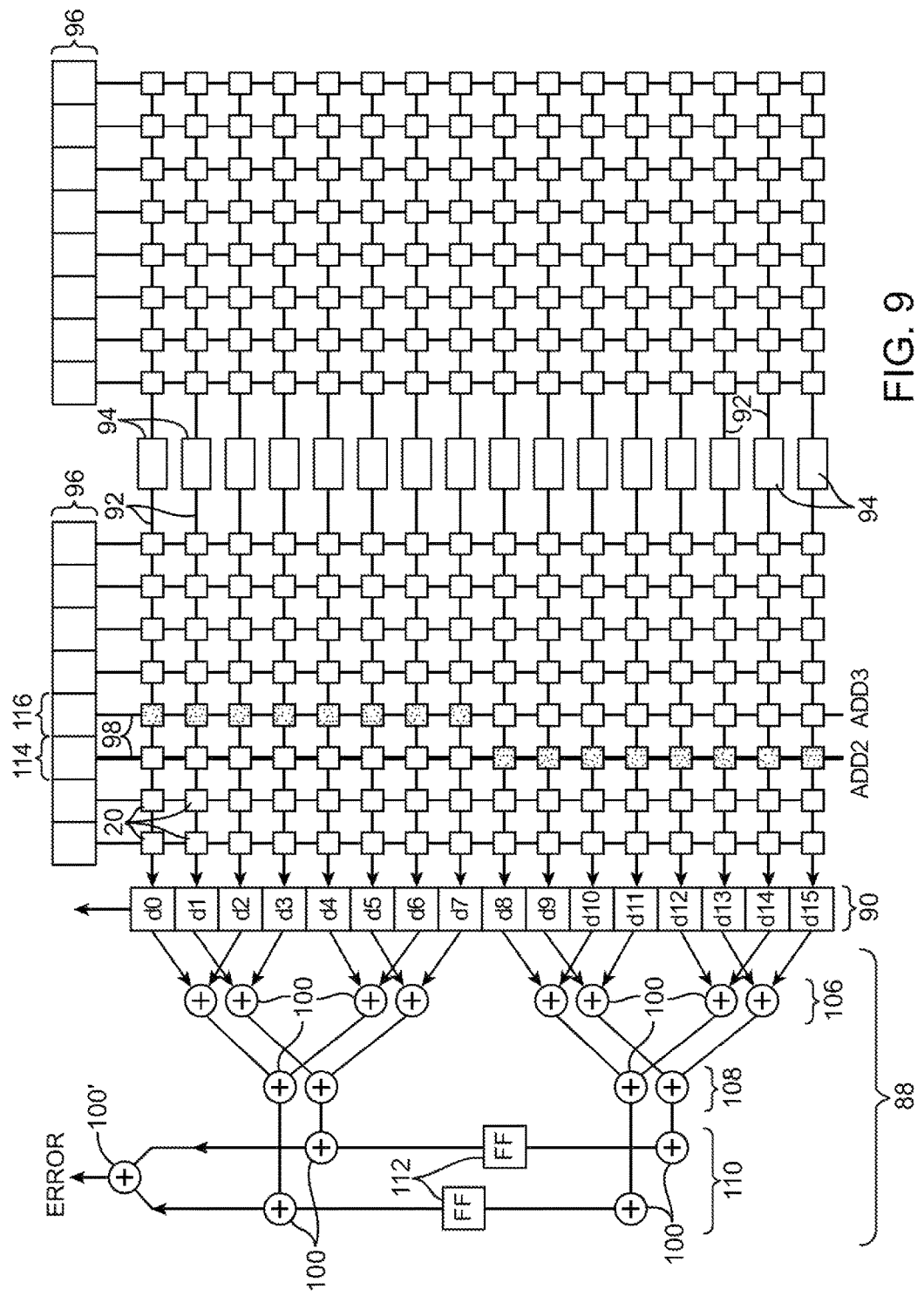
FIG. 9 is a diagram of an illustrative integrated circuit with the error detection circuitry of FIG. 7 in accordance with an embodiment of the present invention.

Pipelining using flip-flops 112 may introduce at least one additional clock cycle delay in processing data accessed from each selected column. Consider an example as shown in FIG. 9 in which pipelined (e.g., single-bit chain per pipeline stage)/two-way interleaved error detection circuitry 88 with four-bit trees is used to perform error detection across a memory array with 16 rows of cells 20. In a given clock cycle, memory data in column 114 may be accessed and latched by data register 90 (e.g., control signal ADD2 may be asserted to select column 114). Cells 20 in the lower half of column 114 (e.g., shaded cells 20 in column 114 corresponding to bit indices d8-d15) may be processed by circuitry 88. A resulting first partial result may be latched by flip-flops 112.

In a successive clock cycle following the given clock cycle, memory data in column 116 may be accessed and latched by data register 90 (e.g., control signal ADD3 may be asserted to select column 116). Cells 20 in the upper half of column 116 (e.g., shaded cells 20 in column 116 corresponding to bit indices d0-d7) may be processed by circuitry 88 to obtain a second partial result. The first and second partial results may be combined using XOR gate 100' to provide signal ERROR. Signal ERROR indicates whether a single-bit error or an adjacent double-bit error has been detected for the shaded cells.

Although data register 90 samples a single column of cells 20 per clock cycle, each parity check computation that is performed may be based on data bits gathered from different cell columns (e.g., a single parity check computation may be based on a first portion of cells gathered from a first cell column and a second portion of cells gathered from a second cell column that is adjacent to the first cell column). Performing parity checking based on offset or skewed data bits may sometimes be referred to as performing error detection across "diagonal stripes" or diagonal regions of memory.

At least one set of parity check bits may be loaded into a selected row of cells in device 10. Computation of parity check bits for pipelined circuitry 88 may take into account the latency of pipelined registers 112. In one suitable arrangement, the parity bits are precomputed using computer-aided-design tools such as tools 56 as described in connection with FIG. 2 (e.g., tools 56 may compute the parity of each diagonal stripe).

In another suitable arrangement, the parity bits may be computed as device 10 is loaded with memory data (e.g., the parity bits are computed during device configuration). Computing parity bits in this way inherently takes into account the pipeline latency, because pipeline flip-flops 112 are in use during parity computation. Parity bits computed during device configuration may be loaded into desired rows of cells 20 prior to error detection operations. Other ways of computing parity bits may be used, if desired.

The example of FIG. 9 includes two pipeline stages that are separated by pipeline registers 112. In devices that contain a large number of cell rows, more than two pipeline stages may be used. For example, consider a scenario in which device 10 includes 10,000 cell rows and 20,000 columns of cells 20. The 10,000 rows may be partitioned into 40 pipeline stages with 39 pipeline registers 112 (as an example). Each parity check may therefore be based on data bits gathered from 40 different cell columns (e.g., each full diagonal stripe may include memory data from 40 different cell columns). Partial columns (partial stripes) at the left and right edges of the memory array may also be processed. In this example, 20,039 parity checks may be performed to process the full and partial diagonal stripes.

Figure 10:
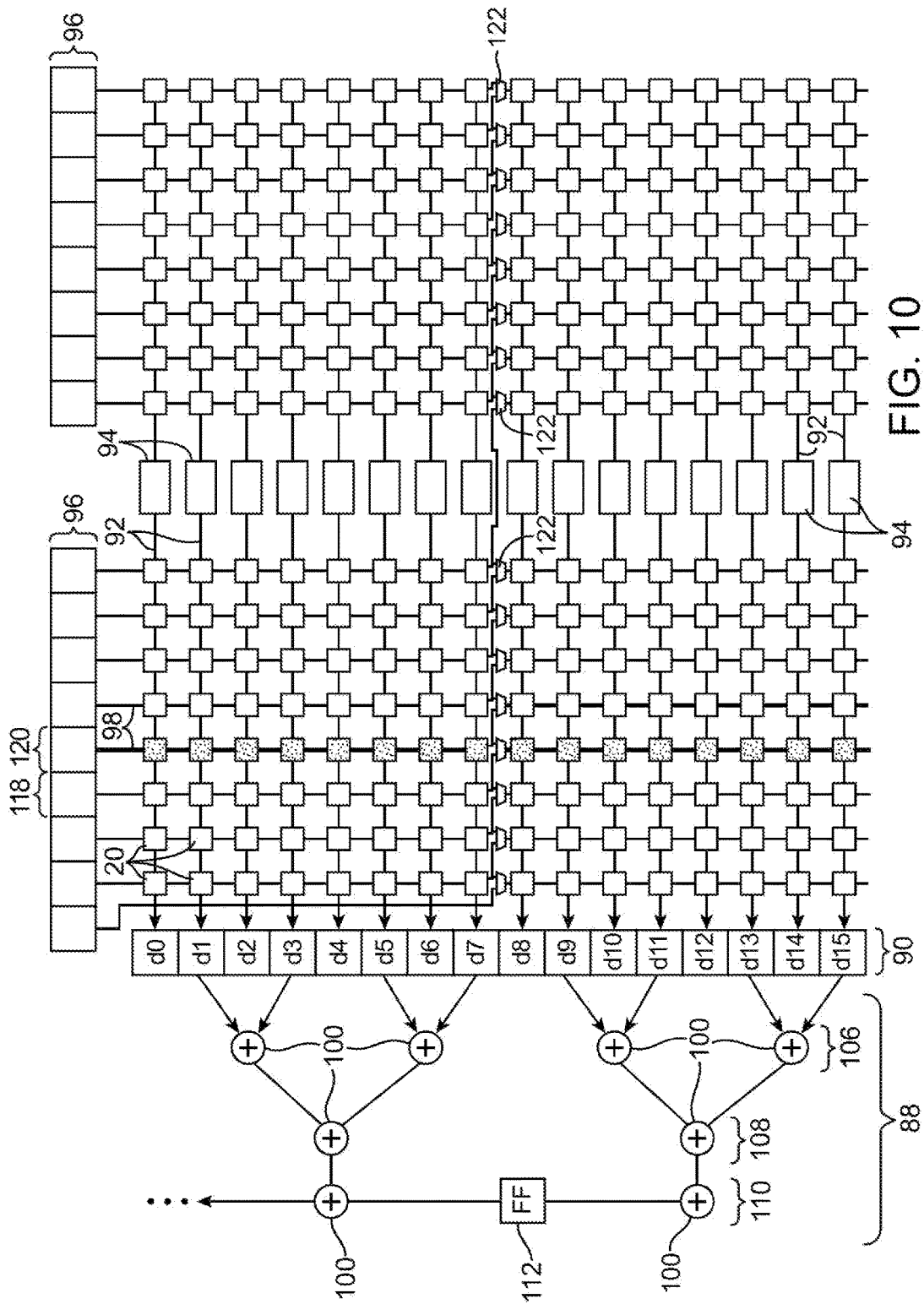
FIG. 10 is a diagram of an illustrative integrated circuit with the error detection circuitry of FIG. 7 and column multiplexers in accordance with an embodiment of the present invention.

The memory circuitry of device 10 may include additional switching circuitry to compensate for the latency through pipeline register 112. As shown in FIG. 10, device 10 may include multiplexer circuits such as multiplexers 122 coupled between different groups of cells in each cell column. Each group of cells 20 may be associated with a respective pipeline stage.

For example, first multiplexer 122 may be coupled between a first group of cells corresponding to indices d0-d7 in a first cell column and a second group of cells corresponding to indices d8-d15 in the first cell column, whereas second multiplexer 122 may be coupled between a first group of cells corresponding to indices d0-d7 in a second cell column and a second group of cells 20 corresponding to indices d8-d15 in the second cell column, etc. Multiplexer 122 that is associated with a given cell column may have a first input that is connected to address line 98 of a preceding cell column, a second input that is connected to first partial address line 98 of the given column (e.g., an address line that is connected to a first portion of cells 20 in that column), an output that is connected to second partial address line 98 of the given column (e.g., an address line that is connected to a second portion of cells 20 in that column), and a control input that receives control signals.

Configuring the memory circuitry of device 10 in this way may allow pipelined error detection circuitry 88 to perform parity checking on single columns instead of on diagonal stripes. Consider the example as shown in FIG. 10 in which pipelined/two-way interleaved error detection circuitry 88 with four-bit trees is used to perform error detection across a memory array with 16 cell rows. During normal operation of device 10, each multiplexer 122 may each be configured by control circuitry to route signals at its second input to its output. During error detection mode, each multiplexer 122 may be configured by the control circuitry to route signals at its first input to its output.

In a given clock cycle during error detection mode, the address signal in column 118 may be asserted. Cells 20 in the lower half of column 120 (i.e., shaded cells 20 in column 120 corresponding to bit indices d8-d15) may be processed by circuitry 88, because multiplexer 122 that is associated with column 118 is configured to route signals at its first input to its output. A resulting first partial result may be latched by flip-flop 112.

In a successive clock cycle following the given clock cycle, the address signal in column 120 may be asserted. Cells 20 in the upper half of column 120 (i.e., shaded cells 20 in column 120 corresponding to bit indices d0-d7) may be processed by circuitry 88 to obtain a second partial result. The first partial result may be provided at the output of flip-flop 112 during the successive clock cycle. The first and second partial results may be combined to provide signal ERROR that indicates whether a single-bit error has been detected for shaded cells 20. As shown in FIG. 10, transitioning the address lines in this way may enable parity checking on cells 20 located along a single cell column. As a result, parity check bits should be computed (e.g., precomputed using software tools or computed in real time during device configuration) based on desired values in each cell column.

Device 10 with a large number of cell columns may exhibit considerable amounts of wire delay when accessing a desired cell along a long data line 92 (e.g., a data line that is connected to one hundred or more cells along a row, one thousand or more cells along a row, etc.).

Figure 11:
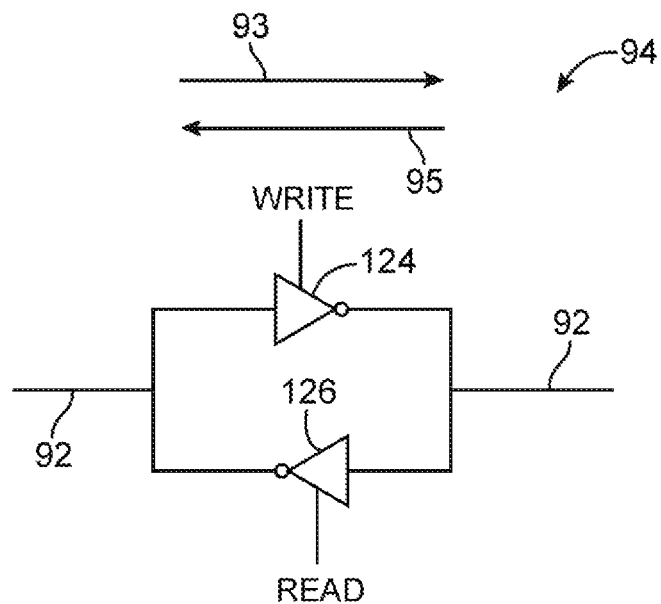
FIG. 11 is a diagram of an illustrative data line buffer in accordance with an embodiment of the present invention.

A non-pipelined DLB such as DLB 94 is shown in FIG. 11. Non-pipelined data line buffer 94 may include tri-state inverters (or buffers) 124 and 126 each having an input and an output. The input of inverter 124 may be connected to the output of inverter 126, whereas the input of inverter 126 may be connected to the output of inverter 124. Inverter 124 may be controlled by signal WRITE, whereas inverter 126 may be controlled by signal READ. If WRITE is high and READ is low, DLB 94 will drive desired signals in the direction of arrow 93 towards a desired cell to be written. If READ is high and WRITE is low, DLB 94 will propagate read data in the direction of arrow 95 to be latched by data register 90.

Figure 12:
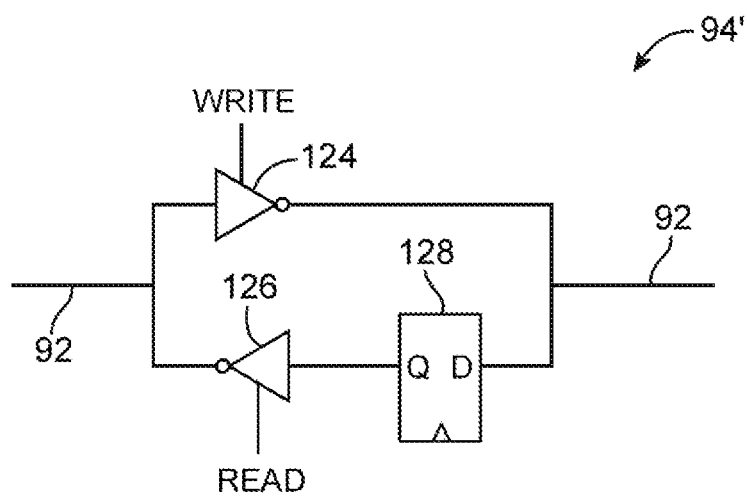
FIG. 12 is a diagram of an illustrative pipelined data line buffer in accordance with an embodiment of the present invention.

Device 10 may include pipelined data line buffers 94' to increase data throughput along data lines 92. As shown in FIG. 12, DLB 94' may include tri-state inverters 124 and 126 each having an input and an output. The input of inverter 124 may be connected to the output of inverter 126, whereas the input of inverter 126 may be coupled to the output of inverter 124 through flip-flop (sometimes referred to as a one-bit data register) 128. Data register 128 may serve to buffer data line signals along the data lines so that read time is limited by the wire delay along a single data segment (e.g., a portion of data line 92 that is coupled to another portion of data line 92 through a single DLB 94').

Figure 13:
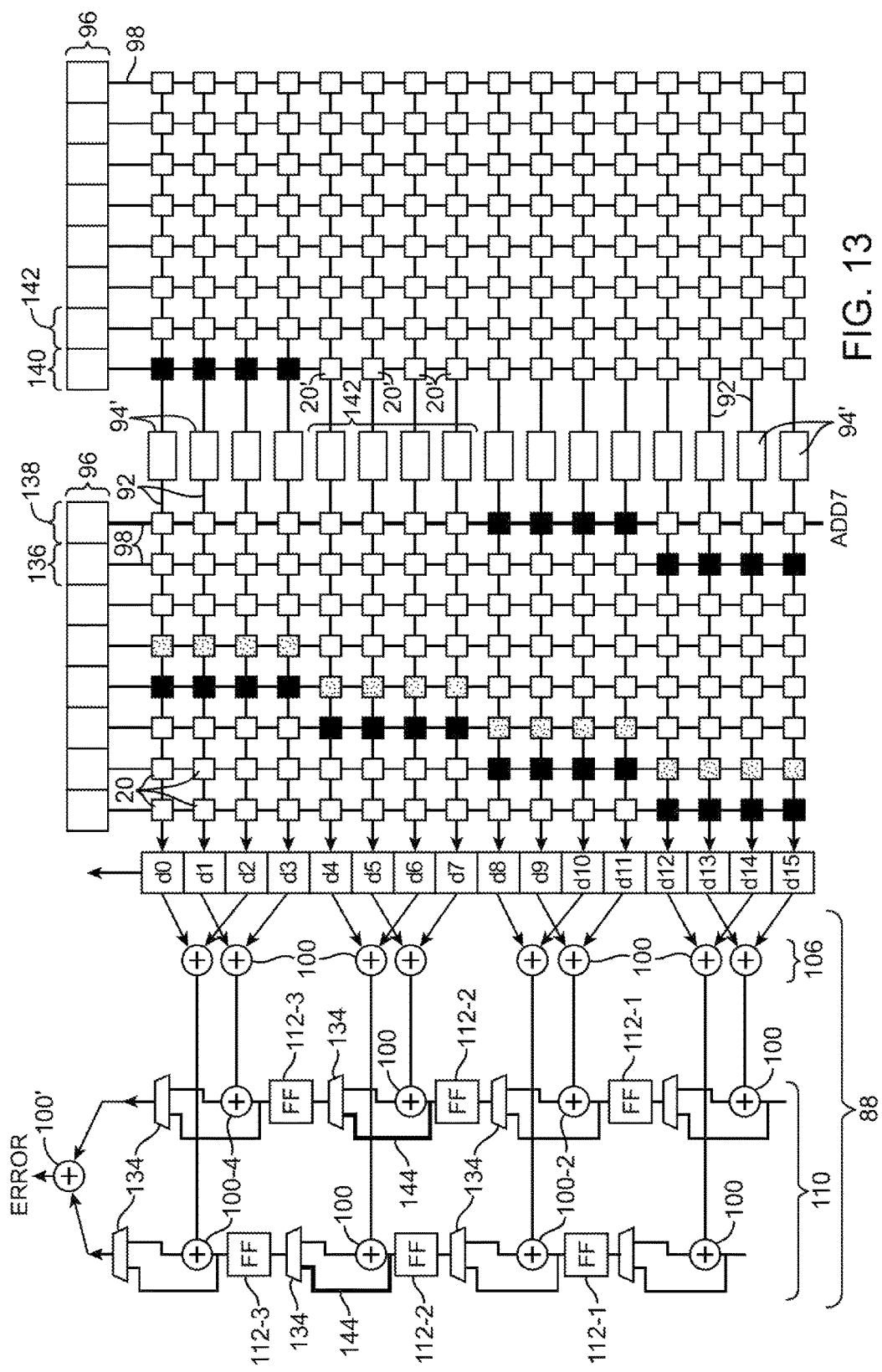
FIG. 13 is diagram of an illustrative integrated circuit with pipelined data line buffers and error detection circuitry in accordance with an embodiment of the present invention.

Pipelining data lines 92 may introduce an additional clock cycle delay for any data that traverses a DLB 94'. FIG. 13 shows device 10 with pipelined DLBs 94' and pipelined (e.g., four single-bit pipeline stages)/two-way interleaved error detection circuitry 88 with two-bit tree. Parity checking for partial and full diagonal stripes may be processed using a similar approached as described in connection with FIG. 9. Parity checking for diagonal stripes that span DLBs 94' may involve additional configuration.

For example, in a first clock cycle, the address signal in column 136 may be asserted. Shaded cells 20 in column 136 corresponding to bit indices d12-d15 may be processed to generate a first partial result. The first partial result may be latched by first flip-flops 112-1 in circuitry 88.

In a second clock cycle, the address signal in column 138 may be asserted. Shaded cells 20 in column 138 corresponding to bit indices d8-d11 may be processed to generate a second partial result. During the second clock cycle, the first partial result may be provided at the output of flip-flops 112-1. The first and second partial result may be combined by XOR gates 100-2 to produce a third partial result. The third partial result may be latched by second flip-flops 112-2 in circuitry 88.

In a third clock cycle, the address signal in column 140 may be asserted. Data bits in shaded cells 20 in column 140 corresponding to bit indices d0-d3 may be latched by corresponding DLBs 94'. Data bits stored in cells 20' in column 140 corresponding to bit indices d8-d11 may be latched by corresponding DLBs 94'. During the third clock cycle, the third partial result cannot be combined with another partial result because data bits in cells 20' are gated by pipelined DLBs 94' (see, e.g., DLBs 94' in region 142 of FIG. 13).

Error detection circuitry 88 may include multiplexers such as multiplexers 134 that can be used to bypass desired partial results. In this example, multiplexers 134 associated with flip-flops 112-3 may be configured to route signals from flip-flops 112-2 directly to flip-flops 112-3 to bypass the gated data bits, as shown by bolded paths 144 in FIG. 13.

In a fourth clock cycle, the address signal in column 142 may be asserted. Data from shaded cells 20 in column 140 may be presented at the outputs of corresponding DLBs 94' to error detection circuitry 88. This data may be processed by circuitry 88 to generate a fourth partial result. Using XOR gates 100-4, the fourth partial result may be combined with the third partial result provided at the output of flip-flop 112-3 to generate signal ERROR. Error detection using pipelined DLBs 94' does not check for soft errors stored in bypassed cells 20'. If the parity bits are computed during device configuration, this DLB delay is naturally taken into account. If the parity bits are precomputed using design tools, the design tools will have to take into account the bypassed (ignored) bits.

The example of FIG. 13 is merely illustrative. More than one column of DLBs 94' may be used in device 10 to provide desired data line segment delay.

Device 10 may further include error-correcting code (ECC) circuitry that is used to correct memory errors on device 10. In response to detecting an error using circuitry 88, the ECC circuitry may be used to identify the exact location(s) of the error(s) and to correct them. The memory array on device 10 may be repeatedly scanned for soft errors. If desired, correct data may be reloaded into the desired columns to correct for error(s).

For example, consider a scenario in which device 10 includes 10,000 rows and 10,000 columns of cells 20, pipelined (e.g., with 20 pipeline stages)/32-way interleaved circuitry with 16-bit trees, and has a clock cycle of 10 ns. Each group of bits (i.e., each pipeline stage) therefore includes 512 data bits (16*32). In this example, 10,019 parity checks may be performed to process the full and partial diagonal stripes. Because each parity check may be performed within one clock cycle, it may therefore take 100.19 μs ($10{,}019*10*10^{-9}$) to perform error detection across the entire memory array.

If a soft error is detected, there are 20 possible columns that need to be checked using the ECC circuitry. The ECC circuitry may perform error detection and correction in 313 clock cycles (10,000 divided by 32) for each 32-way interleaved group of cells. To perform error detection and correction for all 20 columns, it will therefore take 6,260 clock cycles (20*313) or 62.6 μs ($6260*10*10^{-9}$). Performing error detection and correction using circuitry 88 and the ECC circuitry may therefore take a total of 163 μs (100.19+62.6), which is more than 100 times faster than that of conventional error detection and correction circuitry.

The foregoing is merely illustrative of the principles of this invention and various modifications can be made by those skilled in the art without departing from the scope and spirit of the invention.

What is claimed is:

1. An integrated circuit comprising:
   a memory array having a first set of memory elements arranged along a first column and a second set of memory elements arranged along a second column;
   a multiplexing circuit coupled between the first set of memory elements and the second set of memory elements;
   a first circuit operable to detect errors in the first and second sets of memory elements;
   a second circuit operable to locate and correct the detected errors in the first and second sets of memory elements; and
   control circuitry coupled to the first and second circuits, wherein the control circuitry is operable to control the second circuit to locate and correct the detected errors in response to detecting errors using the first circuit.

2. The integrated circuit defined in claim 1, further comprising:
   a data register operable to receive data from the first and second sets of memory elements.

3. The integrated circuit defined in claim 2, wherein the first circuit comprises a set of logic gates each of which is coupled to a respective data storage element in the data register.

4. The integrated circuit defined in claim 3, wherein the set of logic gates comprises exclusive OR gates.

5. The integrated circuit defined in claim 3, further comprising:
   a parity bit memory element operable to store a parity bit associated with the first set of memory elements, wherein the first circuit is configured to receive the parity bit and is configured to detect errors in the first set of memory elements based on the parity bit.

6. The integrated circuit defined in claim 3, wherein the set of logic gates comprises a tree of logic gates, and wherein the tree of logic gates comprises exclusive OR gates.

7. The integrated circuit defined in claim 6, wherein the tree of logic gates comprises one of a plurality of trees of logic gates, further comprising:
   additional logic circuitry operable to receive respective data signals from the plurality of trees of logic gates.

8. The integrated circuit defined in claim 7, wherein the additional logic circuitry comprises a chain of logic gates having an output operable to supply an error detection signal.

9. The integrated circuit defined in claim 1, wherein, during an error detection mode of the integrated circuit, the multiplexing circuitry outputs signals based on the first set of memory elements, and wherein during a normal operating mode of the integrated circuit, the multiplexing circuitry outputs signals based on the second set of memory elements.

10. The integrated circuit defined in claim 1, wherein the first circuit is operable to detect errors within a first time period, wherein the second circuit is operable to locate and correct the detected errors within a second time period, and wherein the first time period is shorter than the second time period.

11. The integrated circuit defined in claim 10, wherein the second circuit comprises an error-correcting-code circuit, and wherein the first time period is at least one hundred times shorter than the second time period.

12. An integrated circuit comprising:
a memory array comprising rows and columns of memory cells;
multiplexing circuitry coupled between first and second sets of columns of the memory array;
a data register coupled to the memory array, comprising a plurality of shift registers; and
error detection circuitry coupled to the data register.

13. The integrated circuit defined in claim 12, wherein each of the shift registers is coupled to at least one row of the memory array, and wherein each of the shift registers is loaded with data from the respective at least one row.

14. The integrated circuit defined in claim 13, wherein the error detection circuitry comprises:
first error detection circuitry coupled to a first subset of the plurality of shift registers, wherein the first error detection circuitry outputs a first signal that is asserted when there is an error in the data loaded in the first subset of shift registers; and
second error detection circuitry coupled to a second subset of the plurality of shift registers that is different than the first subset of shift registers, wherein the second error detection circuitry outputs a second signal that is asserted when there is an error in the data loaded in the second subset of shift registers.

15. The integrated circuit defined in claim 14, wherein the first signal is output independently of the second signal.

16. The integrated circuit defined in claim 14, wherein a flip-flop is interposed between the first error detection circuitry and the second error detection circuitry.

17. The integrated circuit defined in claim 12, wherein the data register is loaded with data from the memory array, and wherein the error detection circuitry performs two-bit adjacent error detection.

18. The integrated circuit defined in claim 12, wherein the data register is loaded with data from the memory array, and wherein the error detection circuitry performs four-bit adjacent error detection.

* * * * *